: (12) United States Patent
Chen (10) Patent No.: US 11,362,625 B2
(45) Date of Patent: Jun. 14, 2022

(54) BALANCED-TO-DOHERTY MODE SWITCHABLE POWER AMPLIFIER

(71) Applicant: University of Central Florida Research Foundation, Inc., Orlando, FL (US)

(72) Inventor: Kenle Chen, Oviedo, FL (US)

(73) Assignee: University of Central Florida, Orlando, FL (US)

( * ) Notice: Subject to any disclaimer, the term of this patent is extended or adjusted under 35 U.S.C. 154(b) by 18 days.

(21) Appl. No.: 16/888,046

(22) Filed: May 29, 2020

(65) Prior Publication Data
US 2020/0382071 A1 Dec. 3, 2020

Related U.S. Application Data

(60) Provisional application No. 62/853,848, filed on May 29, 2019.

(51) Int. Cl.
*H03F 1/02* (2006.01)
*H03F 3/195* (2006.01)
*H03F 3/21* (2006.01)
*H03F 1/56* (2006.01)

(52) U.S. Cl.
CPC ......... *H03F 1/0288* (2013.01); *H03F 1/565* (2013.01); *H03F 3/195* (2013.01); *H03F 3/211* (2013.01); *H03F 2200/387* (2013.01); *H03F 2200/451* (2013.01)

(58) Field of Classification Search
CPC ........ H03F 1/0288; H03F 1/565; H03F 3/195; H03F 3/211; H03F 2200/387; H03F 2200/451

USPC ..................................................... 330/124 R
See application file for complete search history.

(56) References Cited

U.S. PATENT DOCUMENTS

2014/0375389 A1* 12/2014 Jeon .......................... H03F 1/42
330/295
2017/0019071 A1* 1/2017 Kobayashi ............ H03F 1/0288

OTHER PUBLICATIONS

Next Generation Qualcomm RF360 Front End Solution 2014 available at: https://www.qualcomm.com/media/documents/files/next-generation-qualcomm-rf360-front-end-solution-product-brief.pdf.
J. Nam and B. Kim, "The Doherty power amplifier with on-chip dynamic bias control circuit for handset application," IEEE Trans. Microw. Theory Techn., vol. 55, No. 4, pp. 633-642, Apr. 2007.

(Continued)

*Primary Examiner* — Hafizur Rahman
(74) *Attorney, Agent, or Firm* — Meunier Carlin & Curfman LLC (57) ABSTRACT

A balanced-to-Doherty (B2D) mode-reconfigurable power amplifier (PA) has the capability of maintaining high linearity and high efficiency against load mismatch. The reconfigurable PA includes a switch to alternatively connect to a pre-determined resistive load or a pre-determined pure reactive load (jX), i.e., short, open, or finite reactance between an output quadrature coupler and ground. The biasing of Doherty mode is adaptive dependent on the value of reactive loading (jX). The Doherty operation of this PA is based on an architecture configured from a balanced amplifier, e.g., a quasi-balanced amplifier.

19 Claims, 11 Drawing Sheets
(9 of 11 Drawing Sheet(s) Filed in Color)

(56) References Cited

OTHER PUBLICATIONS

D. Gustafsson, J. C. Cahuana, D. Kuylenstierna, I. Angelov, and C. Fager, "A GaN MMIC modified Doherty PA with large bandwidth and reconfigurable efficiency," IEEE Trans. Microw. Theory Techn., vol. 62, No. 12, pp. 3006-3016, Dec. 2014.

L. C. Nunes, P. M. Cabral, and J. C. Pedro, "AM/PM distortion in GaN Doherty power amplifiers," in IEEE MTT-S Int. Microw. Symp. Dig., Jun. 2014, pp. 1-4.

D. Jung, H. Zhao, and H. Wang, "A CMOS highly linear Doherty power amplifier with multigated transistors," IEEE Trans. Microw. Theory Techn., vol. 67, No. 5, pp. 1883-1891, May 2019.

R. Quaglia, V. Camarchia, and M. Pirola, "K-band combined GaAs monolithic Doherty power amplifier," in Proc. IEEE MTT-S Int. Wireless Symp. (IWS), May 2018, pp. 1-3.

C. Campbell et al., "A wideband power amplifier MMIC utilizing GaN on SiC HEMT technology," IEEE J. Solid-State Circuits, vol. 44, No. 10, pp. 2640-2647, Oct. 2009.

M. Hashemi, L. Zhou, Y. Shen, and L. C. N. de Vreede, "A highly linear wideband polar class-E CMOS digital Doherty power amplifier," IEEE Trans. Microw. Theory Techn., vol. 67, No. 10, pp. 4232-4245, Oct. 2019.

M. Ozen, K. Andersson, and C. Fager, "Symmetrical Doherty power amplifier with extended efficiency range," IEEE Trans. Microw. Theory Techn., vol. 64, No. 4, pp. 1273-1284, Apr. 2016.

J. Xia, M. Yang, Y. Guo, and A. Zhu, "A broadband high-efficiency Doherty power amplifier with integrated compensating reactance," IEEE Trans. Microw. Theory Techn., vol. 64, No. 7, pp. 2014-2024, Jul. 2016.

S. Hu, S. Kousai, and H. Wang, "A broadband mixed-signal CMOS power amplifier with a hybrid class-G Doherty efficiency enhancement technique," IEEE J. Solid-State Circuits, vol. 51, No. 3, pp. 598-613, Mar. 2016.

A. Grebennikov and J. Wong, "A dual-band parallel Doherty power amplifier for wireless applications," IEEE Trans. Microw. Theory Techn., vol. 60, No. 10, pp. 3214-3222, Oct. 2012.

R. Darraji, D. Bhaskar, T. Sharma, M. Helaoui, P. Mousavi, and F. M. Ghannouchi, "Generalized theory and design methodology of wideband Doherty amplifiers applied to the realization of an octave-bandwidth prototype," IEEE Trans. Microw. Theory Techn., vol. 65, No. 8, pp. 3014-3023, Aug. 2017.

R. Giofre, L. Piazzon, P. Colantonio, and F. Giannini, "A distributed matching/combining network suitable for Doherty power amplifiers covering more than an octave frequency band," in IEEE MTT-S Int. Microw. Symp. Dig., Jun. 2014, pp. 1-3.

D. Gustafsson, J. C. Cahuana, D. Kuylenstierna, I. Angelov, N. Rorsman, and C. Fager, "A wideband and compact GaN MMIC Doherty amplifier for microwave link applications," IEEE Trans. Microw. Theory Techn., vol. 61, No. 2, pp. 922-930, Feb. 2013.

A. Agah, H.-T. Dabag, B. Hanafi, P. M. Asbeck, J. F. Buckwalter, and L. E. Larson, "Active millimeter-wave phase-shift Doherty power amplifier in 45-nm SOI CMOS," IEEE J. Solid-State Circuits, vol. 48, No. 10, pp. 2338-2350, Oct. 2013.

E. Kaymaksut, D. Zhao, and P. Reynaert, "Transformer-based Doherty power amplifiers for mm-wave applications in 40-nm CMOS," IEEE Trans. Microw. Theory Techn., vol. 63, No. 4, pp. 1186-1192, Apr. 2015.

J.-H. Tsai and T.-W. Huang, "A 38-46 GHz MMIC Doherty power amplifier using post-distortion linearization," IEEE Microw. Wireless Compon. Lett., vol. 17, No. 5, pp. 388-390, May 2007.

M. Ozen, N. Rostomyan, K. Aufinger, and C. Fager, "Efficient millimeter wave Doherty PA design based on a low-loss combiner synthesis technique," IEEE Microw. Wireless Compon. Lett., vol. 27, No. 12, pp. 1143-1145, Dec. 2017.

P. Indirayanti and P. Reynaert, "A 32 GHz 20 dBm-PSAT transformerbased Doherty power amplifier for multi-GB/s 5G applications in 28 nm bulk CMOS," in Proc. IEEE Radio Freq. Integr. Circuits Symp. (RFIC), Jun. 2017, pp. 45-48.

S. Hu, F. Wang, and H. Wang, "A 28-/37-/39-GHz linear Doherty power amplifier in silicon for 5G applications," IEEE J. Solid-State Circuits, vol. 54, No. 6, pp. 1586-1599, Jun. 2019.

Y. Hu and S. Boumaiza, "Power-scalable wideband linearization of power amplifiers," IEEE Trans. Microw. Theory Techn., vol. 64, No. 5, pp. 1456-1464, May 2016.

X. Fang, A. Chung, and S. Boumaiza, "Linearity-enhanced Doherty power amplifier using output combining network with predefined AM-PM characteristics," IEEE Trans. Microw. Theory Techn., vol. 67, No. 1, pp. 195-204, Jan. 2019.

Y. Hu and S. Boumaiza, "Doherty power amplifier distortion correction using an RF linearization amplifier," IEEE Trans. Microw. Theory Techn., vol. 66, No. 5, pp. 2246-2257, May 2018.

W. Hallberg, M. Ozen, D. Gustafsson, K. Buisman, and C. Fager, "A Doherty power amplifier design method for improved efficiency and linearity," IEEE Trans. Microw. Theory Techn., vol. 64, No. 12, pp. 4491-4504, Dec. 2016.

V. Camarchia et al., "A design strategy for AM/PM compensation in GaN Doherty power amplifiers," IEEE Access, vol. 5, pp. 22244-22251, Oct. 2017.

X. Chen, S. Zhang, and Q. Li, "A review of mutual coupling in MIMO systems," IEEE Access, vol. 6, pp. 24706-24719, May 2018.

C. Fager, X. Bland, K. Hausmair, J. C. Cahuana, and T. Eriksson, "Prediction of smart antenna transmitter characteristics using a new behavioral modeling approach," in IEEE MTT-S Int. Microw. Symp. Dig., Jun. 2014, pp. 1-4.

D. M. Pozar, "A relation between the active input impedance and the active element pattern of a phased array," IEEE Trans. Antennas Propag., vol. 51, No. 9, pp. 2486-2489, Sep. 2003.

C. Fager, T. Eriksson, F. Barradas, K. Hausmair, T. Cunha, and J. C. Pedro, "Linearity and efficiency in 5G transmitters: New techniques for analyzing efficiency, linearity, and linearization in a 5G active antenna transmitter context," IEEE Microw. Mag., vol. 20, No. 5, pp. 35-49, May 2019.

M. A. de Jongh, A. van Bezooijen, T. Bakker, K. R. Boyle, and J. Stulemeijer, "A low-cost closed-loop antenna tuner module for mobile phone single-feed multi-band antennas," in Proc. Eur. Microw. Conf. (EuMC), Oct. 2013, pp. 1171-1174.

S. Hu, S. Kousai, and H. Wang, "Antenna impedance variation compensation by exploiting a digital Doherty power amplifier architecture," IEEE Trans. Microw. Theory Techn., vol. 63, No. 2, pp. 580-597, Feb. 2015.

D. Donahue and T. Barton, "A 2-GHz sampled line impedance sensor for power amplifier applications with varying load impedance," in Proc. IEEE Topical Conf. RF/Microw. Power Modeling Radio Wireless Appl. (PAWR), Jan. 2019, pp. 1-3.

H. Lyu, Y. Cao, and K. Chen, "Doherty-to-balanced switchable power amplifier," in IEEE MTT-S Int. Microw. Symp. Dig., Jun. 2019, pp. 1339-1342.

Y. Cao, H. Lyu, and K. Chen, "Wideband Doherty power amplifier in quasi-balanced configuration," in Proc. IEEE 20th Wireless Microw. Technol. Conf. (WAMICON), Apr. 2019, pp. 1-4.

L. Savy and M. Lesturgie, "Coupling effects in MIMO phased array," in Proc. IEEE Radar Conf. (RadarConf), May 2016, pp. 1-6.

X. Wang, Y. Li, C. Yu, W. Hong, and A. Zhu, "Digital predistortion of 5G massive MIMO wireless transmitters based on indirect identification of power amplifier behavior with OTA tests," IEEE Trans. Microw. Theory Techn., vol. 68, No. 1, pp. 316-328, Jan. 2020.

R. Giofre, L. Piazzon, P. Colantonio, and F. Giannini, "A Doherty architecture with high feasibility and defined bandwidth behavior," IEEE Trans. Microw. Theory Techn., vol. 61, No. 9, pp. 3308-3317, Sep. 2013.

R. Giofre, P. Colantonio, F. Giannini, and L. Piazzon, "New output combiner for Doherty amplifiers," IEEE Microw. Wireless Compon. Lett., vol. 23, No. 1, pp. 31-33, Jan. 2013.

D. M. Pozar, Microwave Engineering, 3rd ed. Hoboken, NJ, USA:Wiley, 2005. [Online], Available: https://cds.cern.ch/record/882338.

C. Fager, J. C. Pedro, N. B. Carvalho, H. Zirath, F. Fortes, and M. J. Rosario, "A comprehensive analysis of IMD behavior in RF CMOS power amplifiers," IEEE J. Solid-State Circuits, vol. 39, No. 1, pp. 24-34, Jan. 2004.

(56) References Cited

OTHER PUBLICATIONS

A. Tombak, M. S. Carroll, D. C. Kerr, J.-B. Pierres, and E. Spears, "Design of high-order switches for multimode applications on a silicon-on-insulator technology," IEEE Trans. Microw. Theory Techn., vol. 61, No. 10, pp. 3639-3649, Oct. 2013.
J. Kim, J. Cha, I. Kim, and B. Kim, "Optimum operation of asymmetrical-cells-based linear Doherty power amplifiers-uneven power drive and power matching," IEEE Trans. Microw. Theory Techn., vol. 53, No. 5, pp. 1802-1809, May 2005.
R. Giofre and P. Colantonio, "A high efficiency and low distortion 6 W GaN MMIC Doherty amplifier for 7 GHz radio links," IEEE Microw. Wireless Compon. Lett., vol. 27, No. 1, pp. 70-72, Jan. 2017.
S. Jee, Y. Park, Y. Cho, J. Lee, S. Kim, and B. Kim, "A highly linear dual-band Doherty power amplifier for femto-cell base stations," in IEEE MTT-S Int. Microw. Symp. Dig., May 2015, pp. 1-4.
M. Ozen and C. Fager, "Symmetrical Doherty amplifier with high efficiency over large output power dynamic range," in IEEE MTT-S Int. Microw. Symp. Dig., Jun. 2014, pp. 1-4.
C. Musolff, M. Kamper, and G. Fischer, "Linear Doherty PA at 5 GHz," IEEE Microw. Mag., vol. 16, No. 1, pp. 89-93, Feb. 2015.
X. H. Fang and K.-K.-M. Cheng, "Extension of high-efficiency range of Doherty amplifier by using complex combining load," IEEE Trans. Microw. Theory Techn., vol. 62, No. 9, pp. 2038-2047, Sep. 2014.

* cited by examiner

will be discarded …

BALANCED-TO-DOHERTY MODE SWITCHABLE POWER AMPLIFIER

CROSS REFERENCE TO RELATED APPLICATIONS

This application is a non-provisional of Application Ser. No. 62/853,848, filed May 29, 2019, pending, which application is hereby incorporated by this reference in its entirety for all purposes as if fully set forth herein.

BACKGROUND OF THE INVENTION

Figure 1:
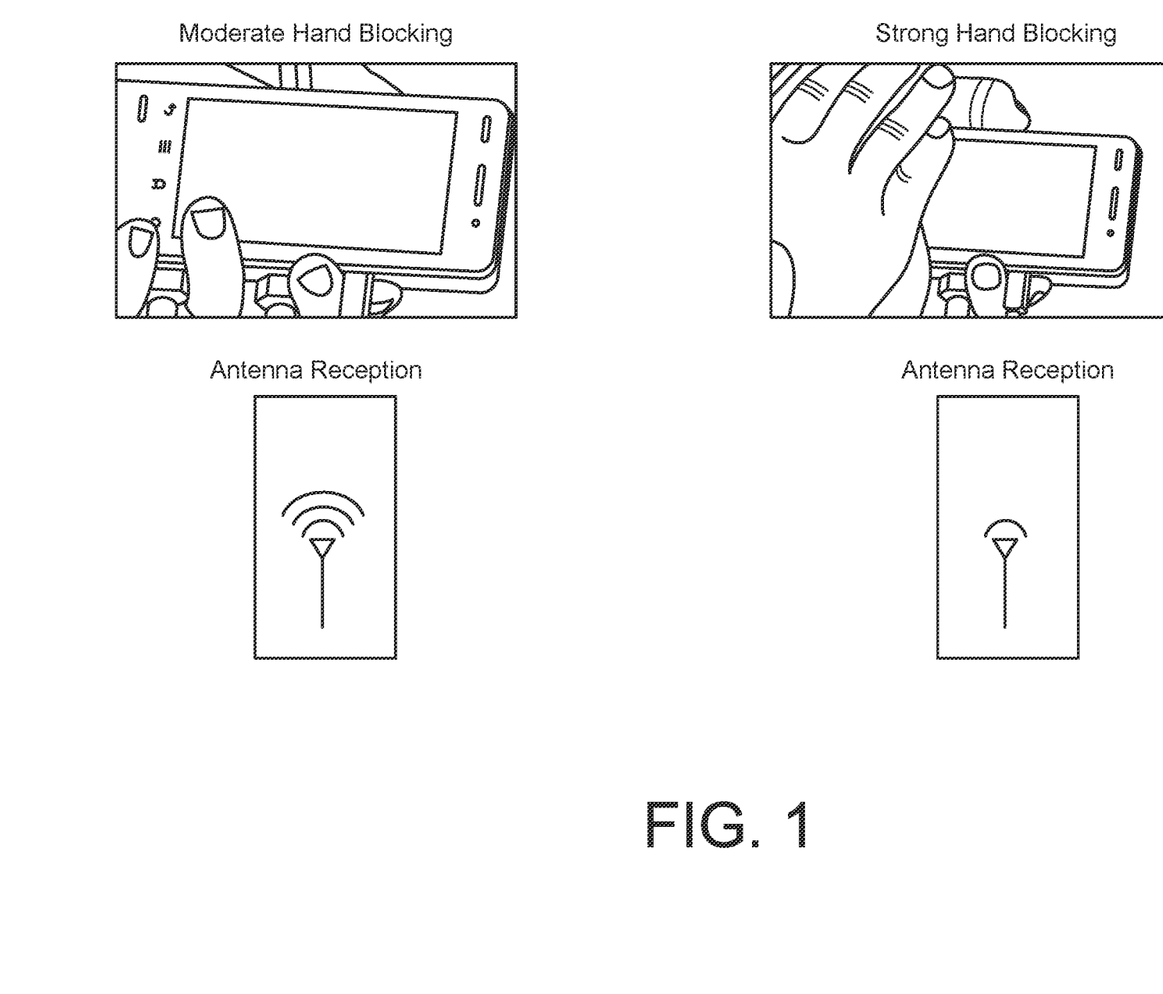
FIG. 1 illustrates hand-blocking issues in antennas for handheld devices.
Figure 2:
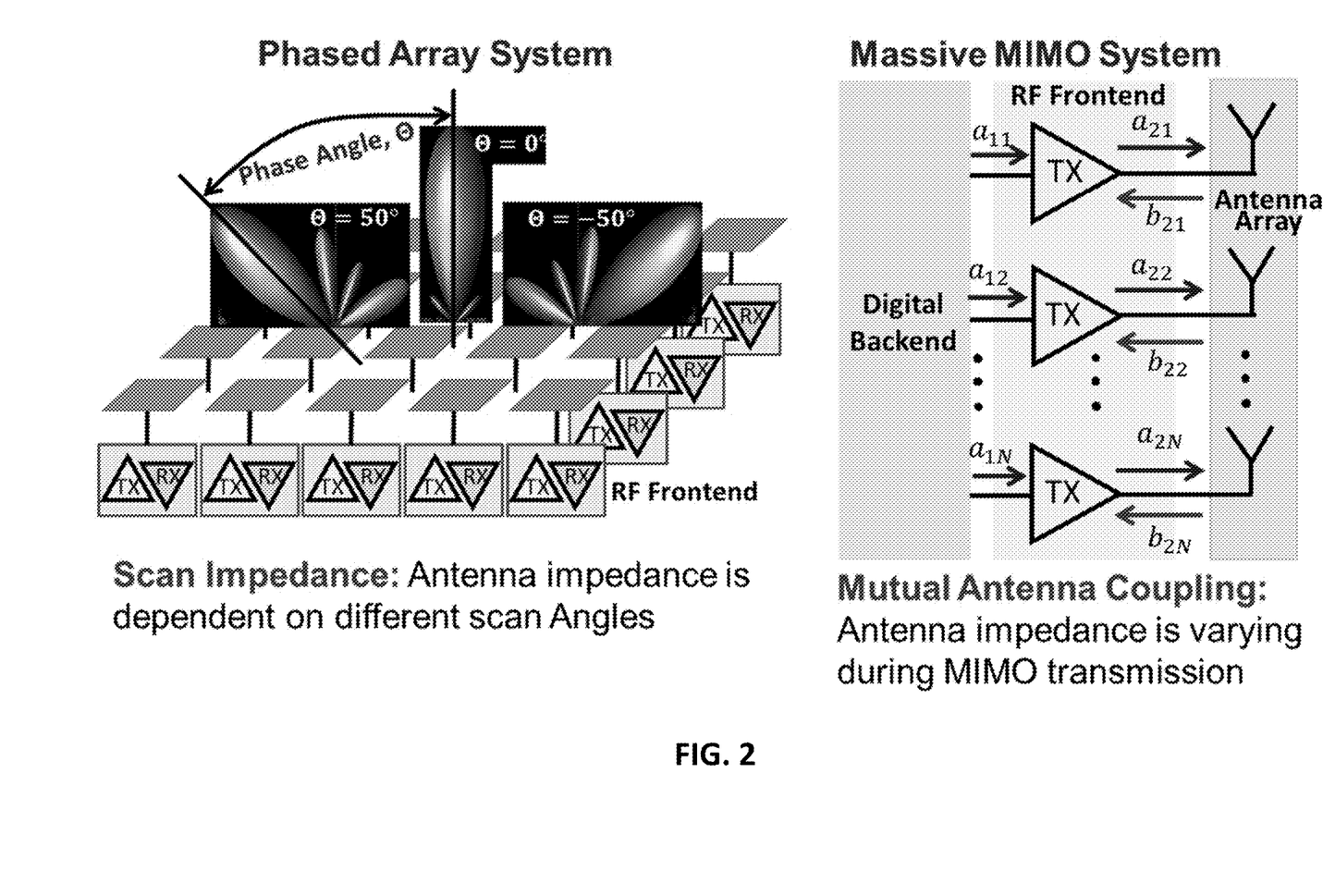
FIG. 2 illustrates large angle beam scanning/mutual coupling and massive MIMO issues in conventional devices.

This invention relates generally to power amplifiers for antennas. A power amplifier (PA) is an essential module in many wireless platforms. A power amplifier boosts wireless signals to a sufficiently high power to be broadcasted to target terminals through antenna. As the load of the PA, the antenna impedance predominantly influences the PA characteristics including power, efficiency, linearity, etc. However, the antenna impedance can be frequently mismatched, and the primary causes are 1) hand-grip effect of cellphones, 2) mutual coupling between antenna elements in a phased array, 3) MIMO operations which will be a major trend in future generation wireless communications. FIG. 1 illustrates hand-blocking issues. FIG. 2 illustrates large angle beam scanning/mutual coupling and massive MIMO issues.

Figure 3:
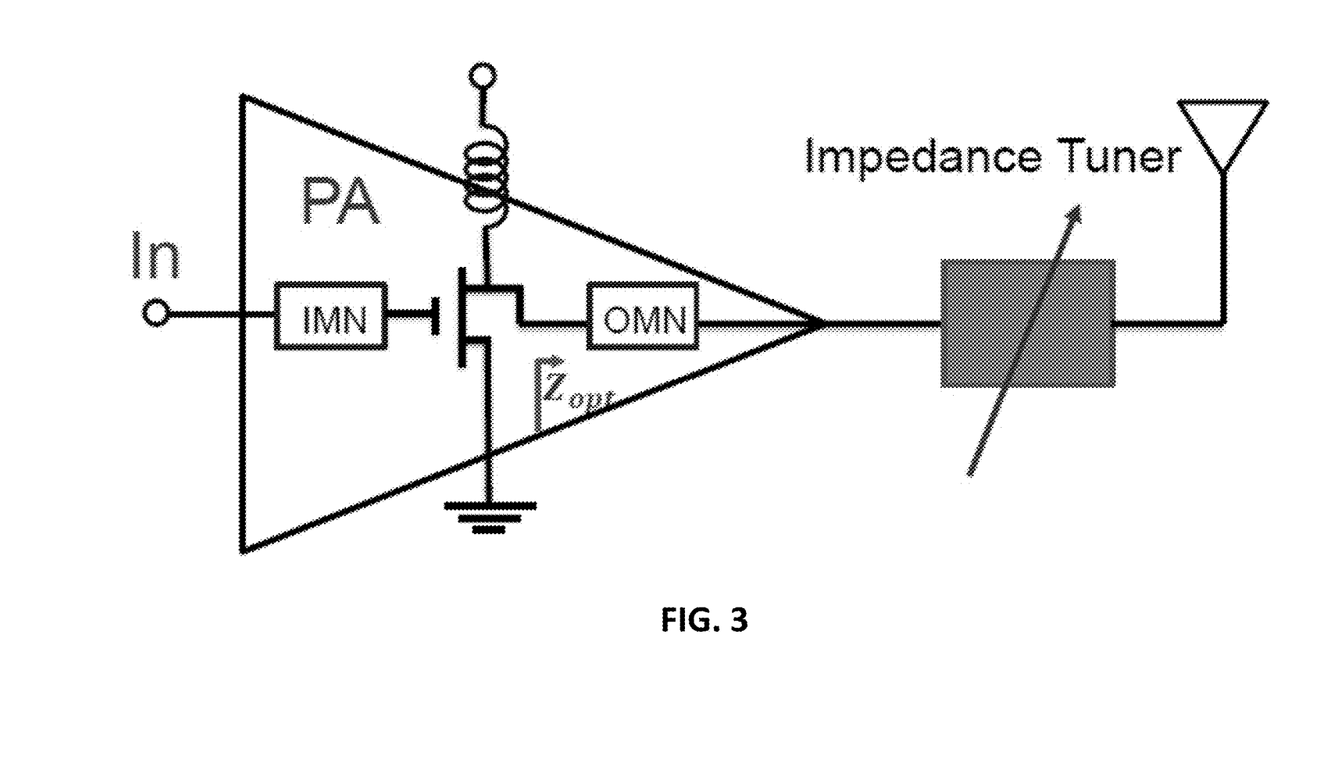
FIG. 3 illustrates a known solution uses a tuner between PA and antenna.

The antenna mismatch not only degrades the PA performance but also leads to reliability and ruggedness issues. One known solution uses a tuner between PA and antenna, as illustrated in FIG. 3. However, this solution can be slow, bulky, lossy, costly and complex. Another known solution uses an isolator/circulator between PA and antenna, which is bulky, lossy, and costly.

SUMMARY OF THE INVENTION

In accordance with the purpose(s) of this invention, as embodied and broadly described herein, this invention, in one aspect, relates to an amplifier circuit including two amplifiers coupled in quadrature phase through input and output 90-degree quadrature hybrids. A switch is placed at the isolation port of the output quadrature coupler to alternatively connect to a pre-determined resistive load or a pre-determined pure reactive load, i.e., short, open, or finite reactance. This switching of isolation-port loading leads to change of PA operation between balance mode (resistive loading) and Doherty mode (reactive loading).

Additional advantages of the invention will be set forth in part in the description which follows, and in part will be obvious from the description, or may be learned by practice of the invention. The advantages of the invention will be realized and attained by means of the elements and combinations particularly pointed out in the appended claims. It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate (one) several embodiment(s) of the invention and together with the description, serve to explain the principles of the invention.

Reference will now be made to the accompanying drawings, which are not necessarily drawn to scale. The patent or application file contains at least one drawing executed in color. Copies of this patent or patent application publication with the color drawing(s) will be provided by the Office upon request and payment of the necessary fee.

DESCRIPTION OF THE EMBODIMENTS

The present invention may be understood more readily by reference to the following detailed description of preferred embodiments of the invention and the Examples included therein and to the Figures and their previous and following description.

As used in the specification and the appended claims, the singular forms "a," "an" and "the" include plural referents unless the context clearly dictates otherwise.

Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

In this specification and in the claims which follow, reference will be made to a number of terms which shall be defined to have the following meanings:

"Optional" or "optionally" means that the subsequently described event or circumstance may or may not occur, and that the description includes instances where said event or circumstance occurs and instances where it does not.

Reference will now be made in detail to the present embodiment, an example(s) of which is illustrated in the accompanying drawings.

A new Doherty-to-balanced reconfigurable power amplifier (PA) architecture is proposed. Under moderate antenna mismatch, the PA operates at Doherty mode that provides high energy efficiency for wireless transmission; under high antenna mismatch, the PA can be reconfigured to balanced mode for mismatch protection and performance recovery. As the antenna mismatch issue and the demands for high efficiency will become ever stronger toward 5G and beyond, this technology is expected to have impact on wireless and semiconductor industries with very broad application horizons.

The proposed technology can enable the elimination of an antenna tuner and/or isolator, leading to smaller size, lower loss and cost, and reduced system complexity. This technology can be directly used in the radio-frequency modules on 4G/5G wireless platforms, e.g., Smartphones and base stations. The prior art based on antenna tuners are not applicable to future 5G system with antenna arrays, and this limitation can be overcome with this technology.

Figure 4:
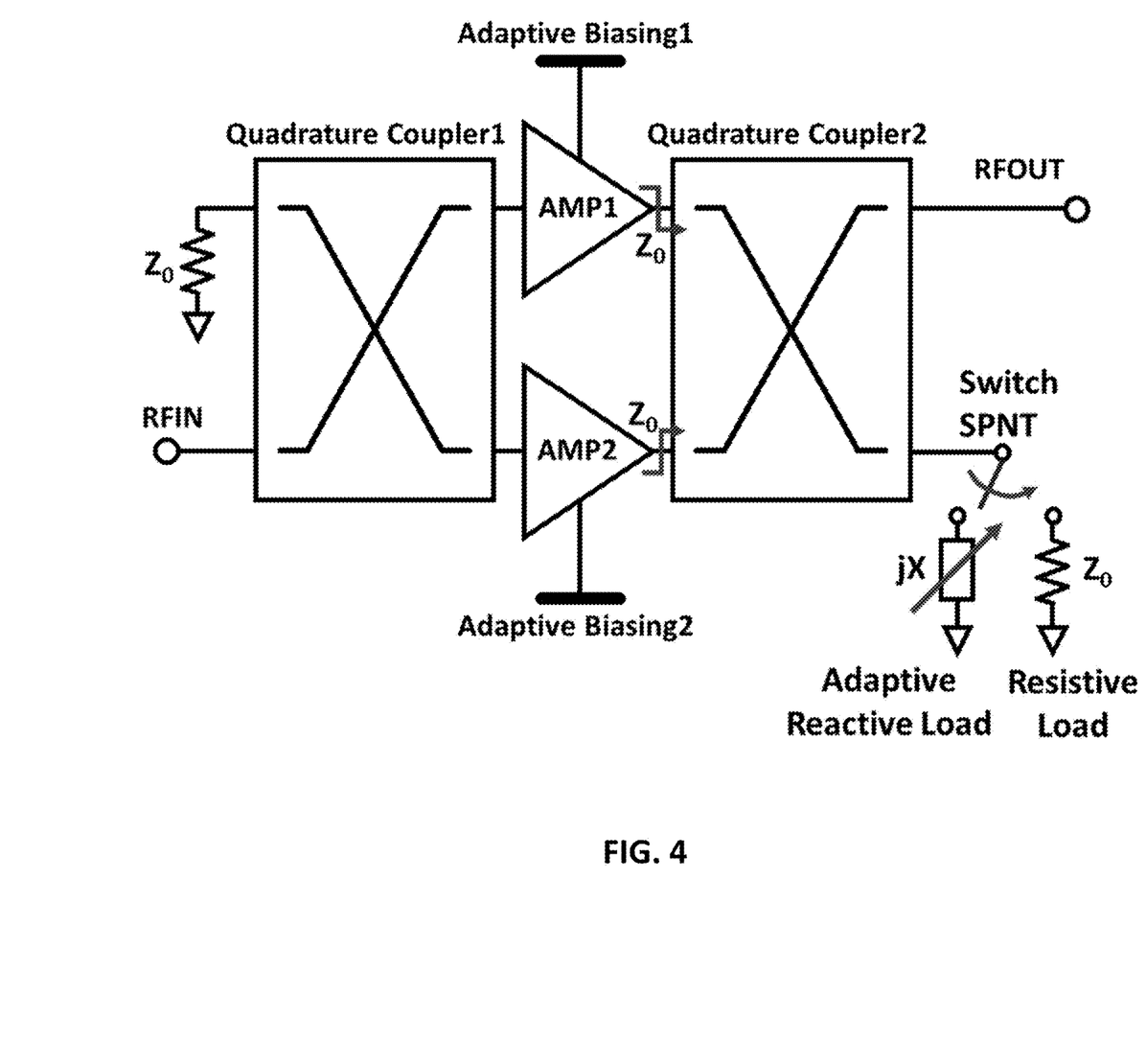
FIG. 4 illustrates basic circuit technology according to principles described herein.

A power amplifier with its operation switchable between Doherty mode and Balanced mode is provided. Doherty mode provides efficient transmission of complex-modulated signals for small Θ with moderate mismatch. Balanced mode recovers PA performance and antenna pattern under large Θ with significant mismatch. Basic circuit topology is shown in FIG. 4. A power amplifier circuit according to principles described herein includes two sub-amplifiers. The sub-amplifiers are coupled in quadrature phase through input and output 90-degree quadrature hybrids, couplers as the input power splitter and output combiner, respectively.

Figure 5:
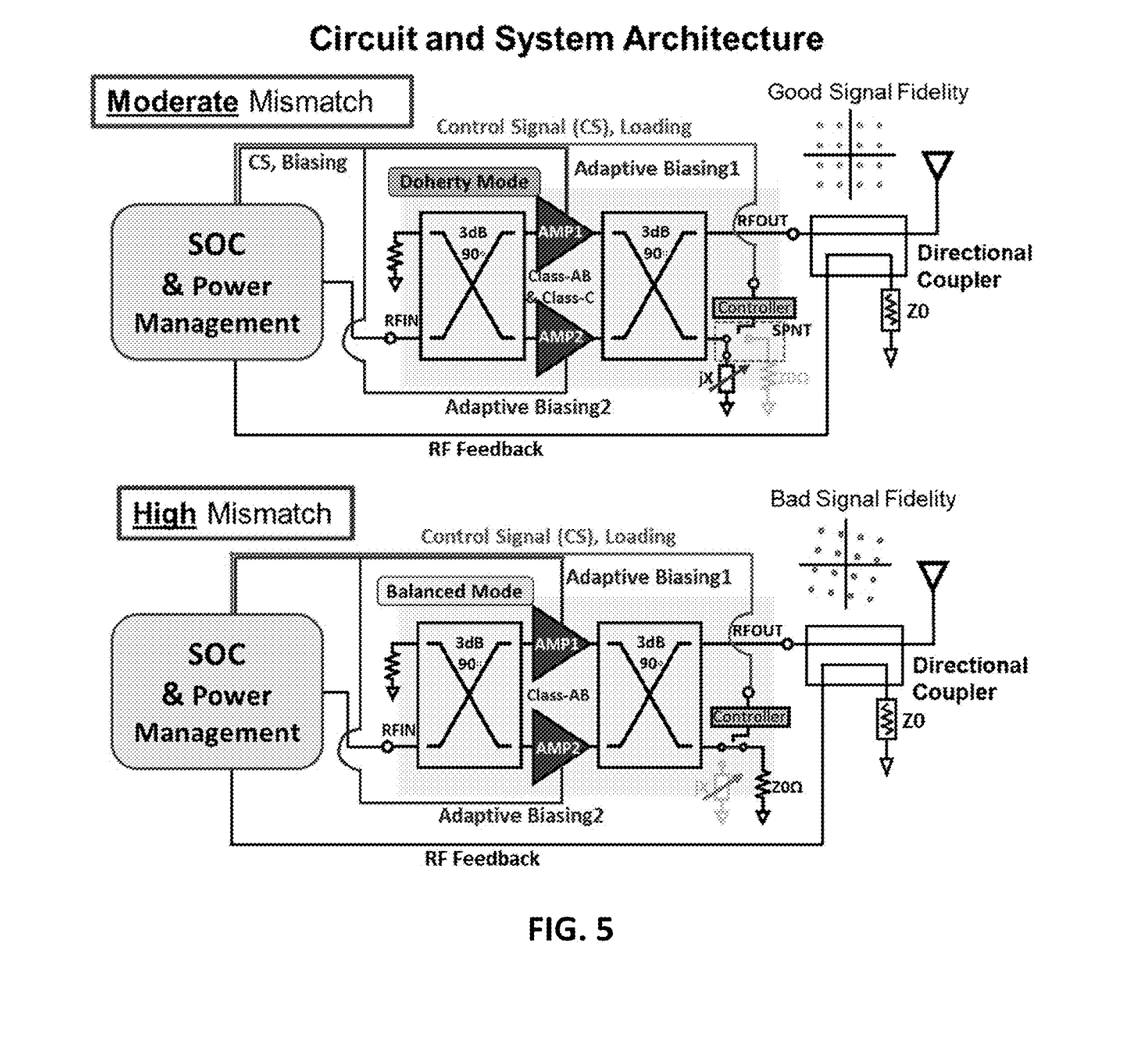
FIG. 5 illustrates an example of overall circuit and system architecture according to principles described herein.

Overall circuit and system architecture is illustrated in FIG. 5. Referring to FIG. 5, a system using a Balanced-to-Doherty mode power amplifier as described herein includes a power amplifier circuit includes two sub-amplifiers. The amplifiers are coupled in quadrature phase through input and output 90-degree quadrature hybrids, 514 and 516 couplers as the input power splitter and output combiner, respectively. As shown in the upper portion of FIG. 5, for moderate mismatch, the switch may connect the isolation port of the output quadrature coupler to the reactive load (jX). In doing so, good signal fidelity is possible. The reactive load (jX) can be selected by controlling the switch (e.g., via a controller, as illustrated) if there is a high signal mismatch, as illustrated in the lower portion of FIG. 5, such that the balanced mode power amplifier produces bad signal fidelity.

As illustrated in FIG. 5 power management and control may be provided by a silicon-on-chip (SOC) circuit, although the scope of this invention is not so limited. The SOC may provide control of the biasing and loading of the various switches, controller and/or components of the system. For example, as seen in FIG. 5, adaptive biasing control is provided by the SOC and may be based on RF feedback from the antenna/directional coupler. Such feedback may include, for example, mismatch and signal quality to inform the control of the power amplifier mode, biasing and loading, including switching between balanced and Doherty mode and adjusting the reactive loading jX of the Doherty amplifier.

In the present example, Class-AB biasing mode of sub-amplifier is illustrated for balanced mode of the power amplifier, although the principles described herein are not so limited. For Doherty mode of the power amplifier, the biasing modes of two sub-amplifiers may be different, e.g., one in Class-AB and the other in Class-C, and interchangeable depending on the reactive loading.

According to principles described herein, a switch 518 is placed at an isolation port of the output quadrature coupler 516 to alternatively connect to a pre-determined resistive load or a pre-determined pure reactive load (jX), i.e., short, open, or variable finite reactance between the output quadrature coupler 516 and ground. As the isolation port is switched, e.g., short circuited to ground, the operation of the PA is reconfigured to the Doherty mode by enabling of the switch. This switching of isolation-port loading together with adapting biasing conditions of two sub amplifiers lead to change of PA operation between balance mode (resistive loading) and Doherty mode (reactive loading). An example Doherty mode amplifier circuit is shown in upper portion of FIG. 5.

Figure 6:
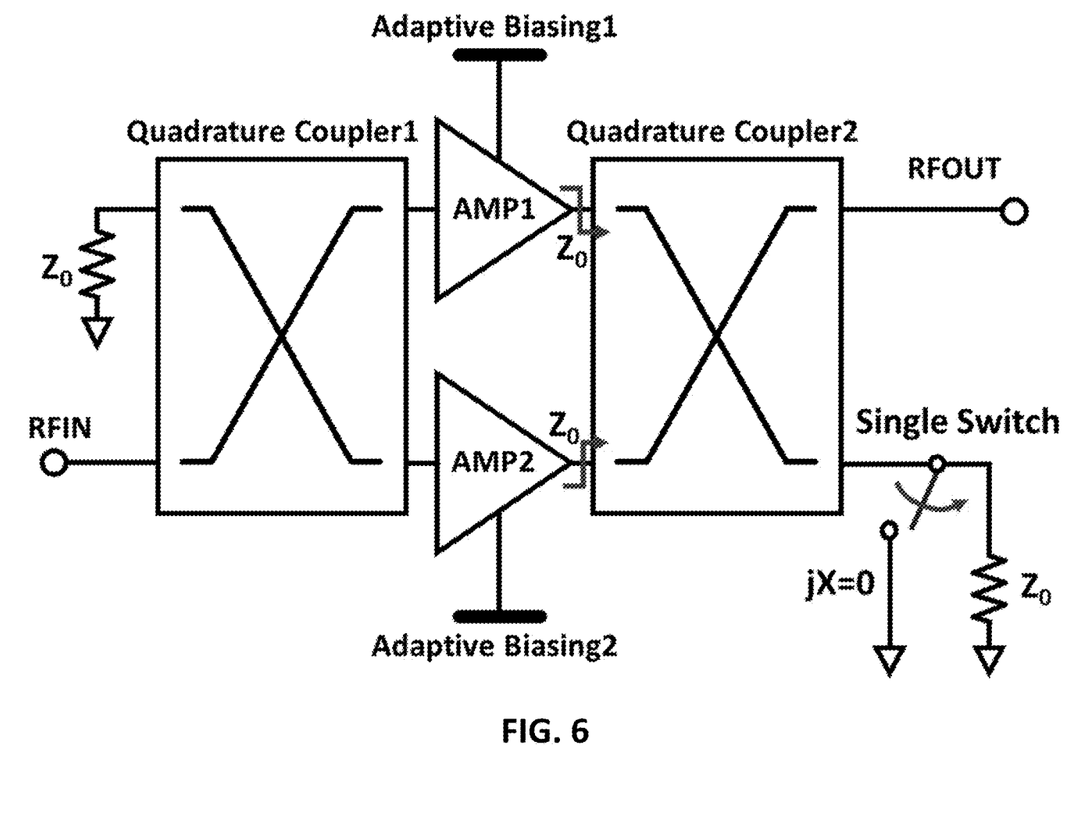
FIG. 6 illustrates a circuit topology for a "short" reactive load.
Figure 7:
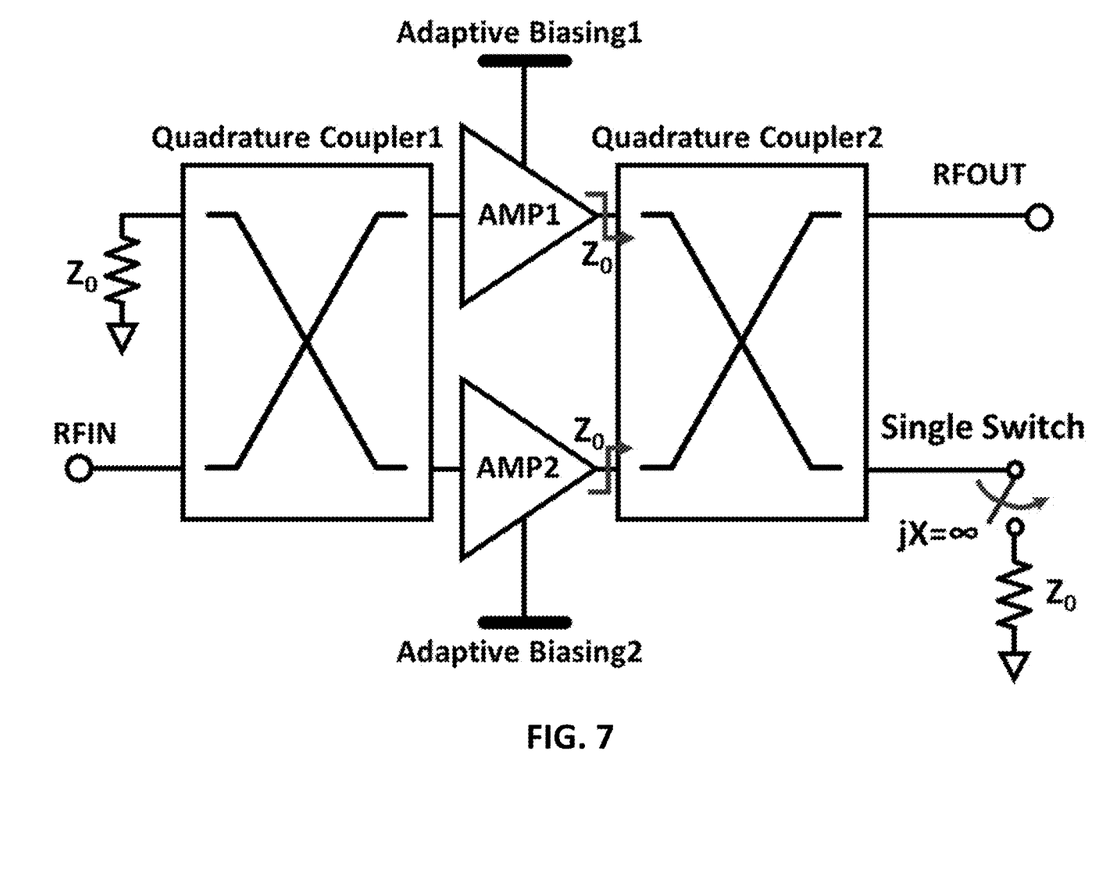
FIG. 7 illustrates a circuit topology for an "open" reactive load.
Figure 8:
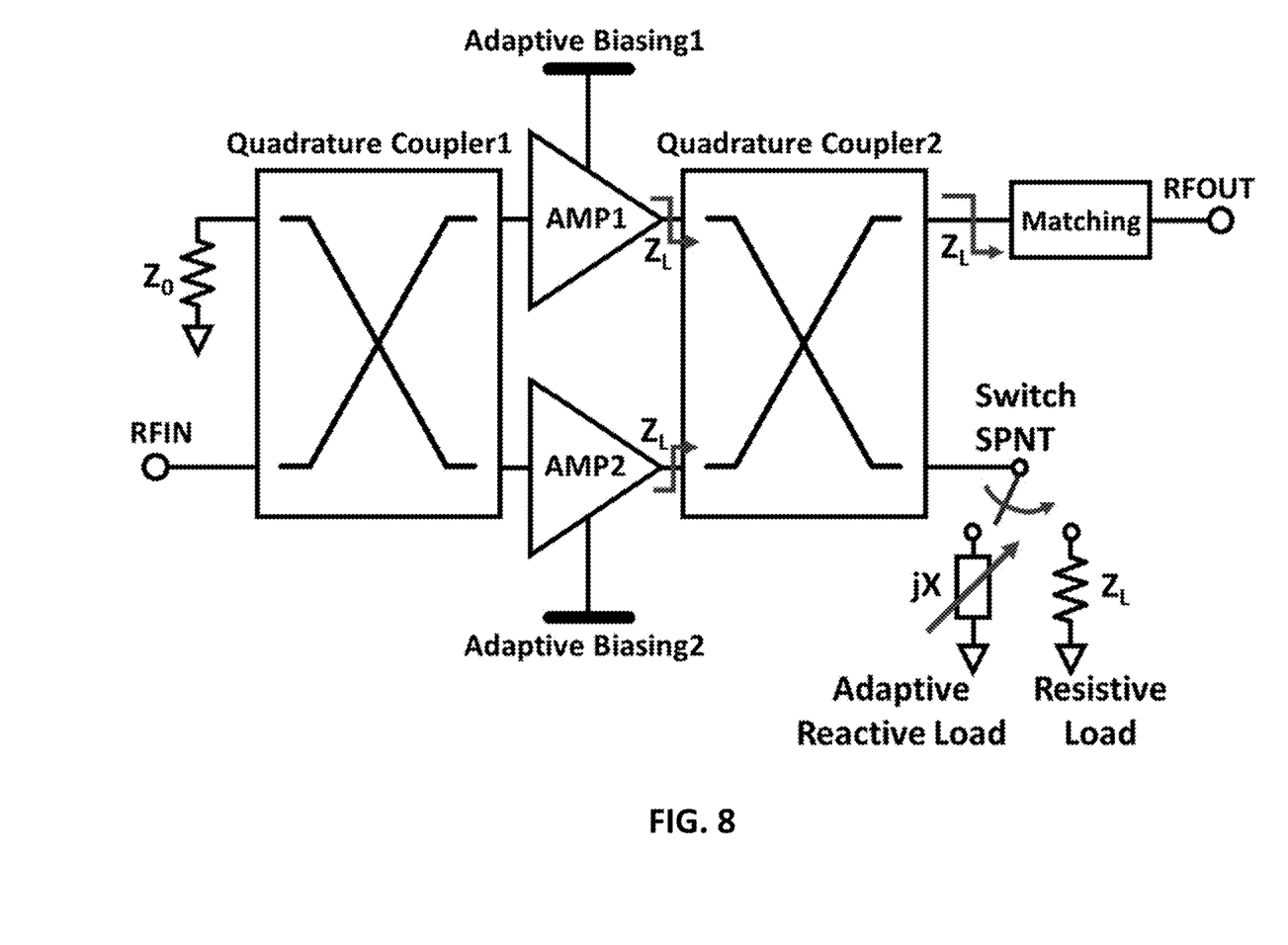
FIG. 8 illustrates a circuit topology using a non-$Z_0$ system impedance of the quadrature coupler.
Figure 9:
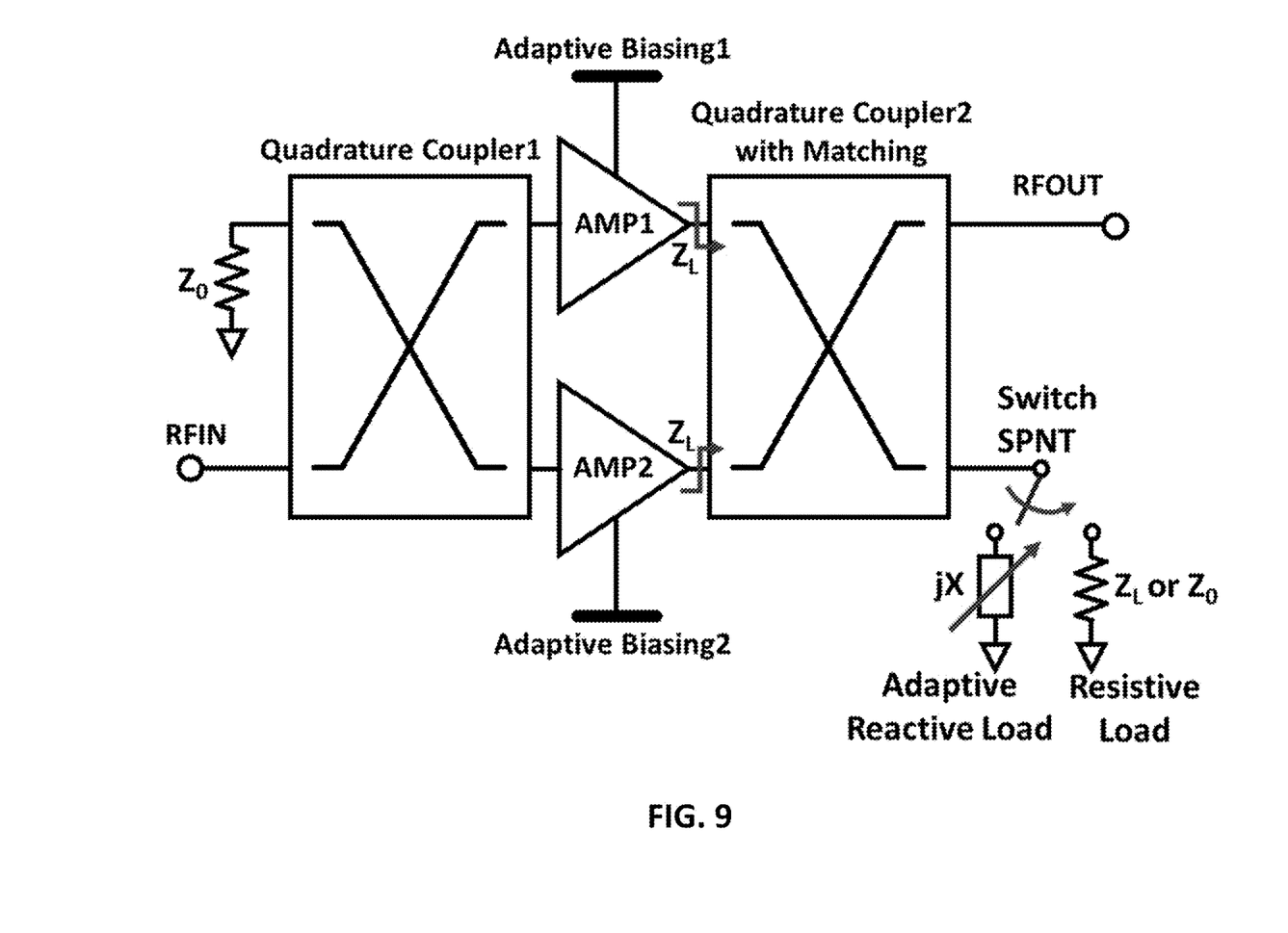
FIG. 9 illustrates a circuit topology using quadrature coupler with matching capabilities.

In another aspect according to principles described herein a circuit topology for a "short" reactive load is shown in FIG. 6. In another aspect according to principles described herein, a circuit topology for an "open" reactive load is shown in FIG. 7. An additional variation on the circuit, using a non-$Z_0$ system impedance of the quadrature coupler, is shown in FIG. 8. An additional variation using quadrature coupler with matching capabilities is shown in FIG. 9.

Notwithstanding the foregoing example, principles described herein may be applied with FET-based, BJT-based, or any other types of power amplifiers. The switch can take the form of single-pole double-through (SP2T) circuitry (as noted in FIG. 1 by the dashed box) or other possible circuit topologies implemented using solid-state technologies, such as CMOS, SOI, MEMS and GaAs pHEMT. The implementation of this new power amplifier can take a few variants which all are covered in this patent.

Figure 10:
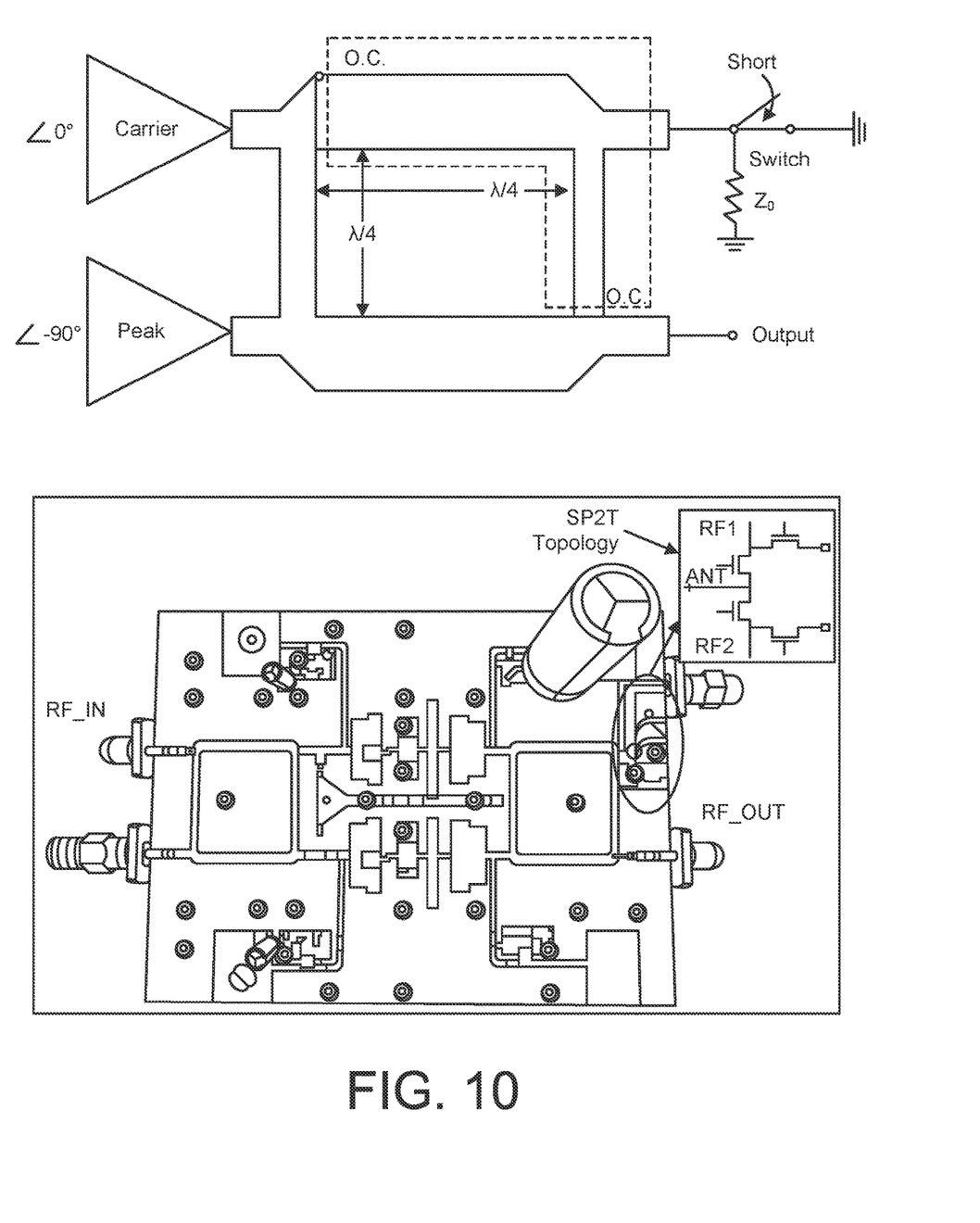
FIG. 10 shows a prototype according to principles described herein and its circuit topology.
Figure 11:
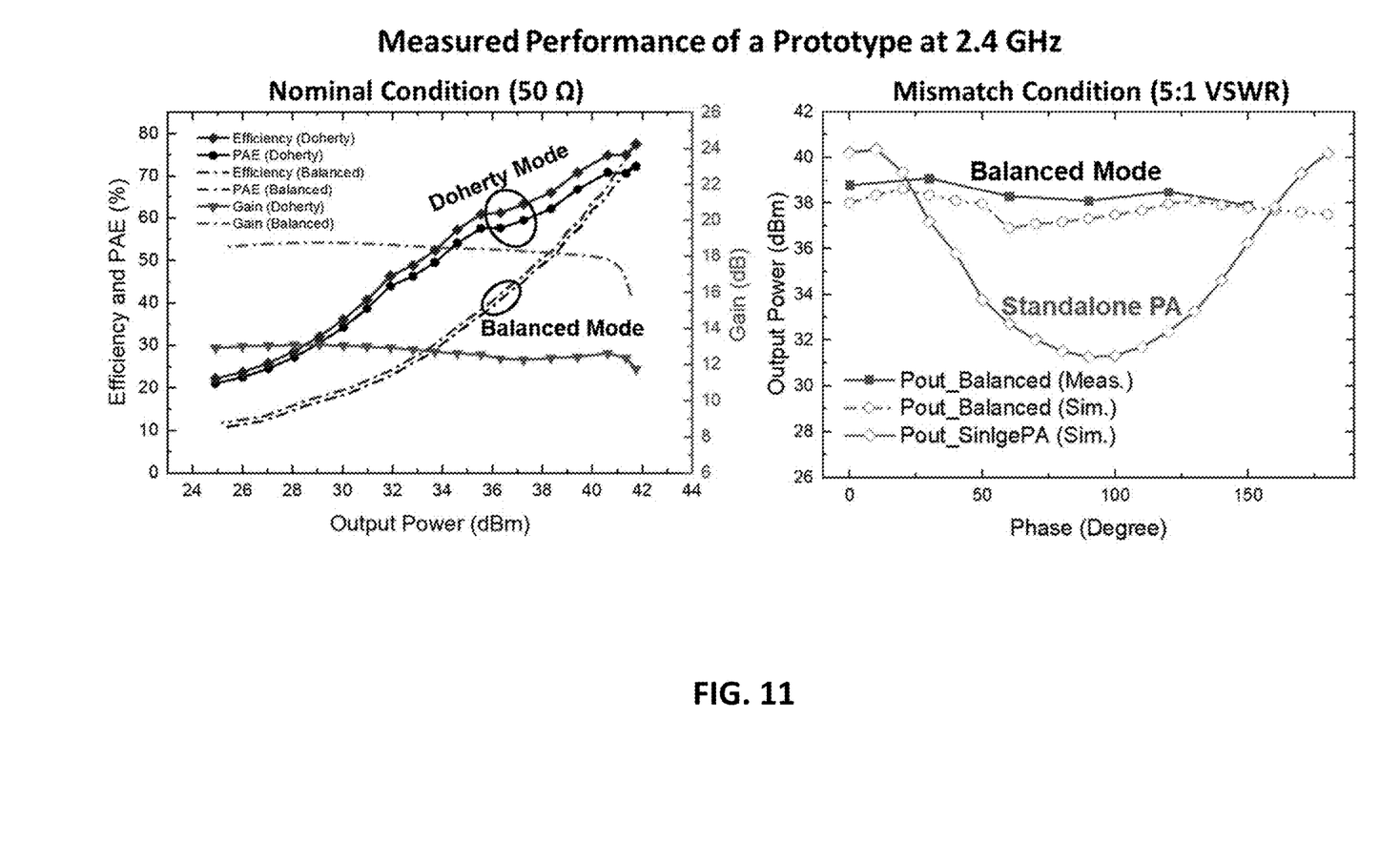
FIG. 11 show measured performance of the prototype circuit of FIG. 10.

A prototype circuit demonstration has been developed and is illustrated in FIG. 10. Measured performance of the prototype at 2.4 GHz is shown in FIG. 11. The left graph of FIG. 10 shows output power versus efficiency and power-added efficiency (PAE) and gain for balanced mode and Doherty mode operation of the prototype circuit at nominal condition (50Ω). The right graph of FIG. 11 shows phase versus output power at mismatch condition (Performance Across 5:1 Voltage Standing Wave Ratio (VSWR) Circle).

The above examples are put forth so as to provide those of ordinary skill in the art with a complete disclosure and description of how the compounds, compositions, articles, devices and/or methods claimed herein are made and evaluated, and are intended to be purely exemplary of the invention and are not intended to limit the scope of what the inventors regard as their invention. Efforts have been made to ensure accuracy with respect to numbers (e.g., amounts, temperature, etc.) and variation is considered to be within the scope of this disclosure.

The proposed technology can enable the elimination of such a tuner, leading to smaller size, lower loss and cost, and reduced system complexity. This technology can be directly used in the radio-frequency modules on 4G/5G wireless platforms, e.g., Smartphones and base stations. The prior art based on antenna tuners are not applicable to future 5G system with antenna arrays, and this shortcoming can be overcome with this technology.

It will be apparent to those skilled in the art that various modifications and variations can be made in the present invention without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An amplifier circuit, comprising:
    two amplifiers with adaptive biasing coupled in quadrature phase via an input quadrature coupler and an output quadrature coupler; and
    a switch connected to the output quadrature coupler, the switch moveable between a predetermined resistive load and a predetermined reactive load, wherein the amplifier circuit has a balanced mode when the switch is in a first position and Doherty mode when the switch is in a second position.

2. The amplifier circuit of claim 1, wherein the switch is connected to an isolation port of the output quadrature coupler.

3. An amplifier circuit, comprising:
two amplifiers coupled in quadrature phase via an input quadrature coupler and an output quadrature coupler; and
a switch connected to the output quadrature coupler, the switch moveable between a predetermined resistive load and a predetermined reactive load,
wherein said amplifier circuit has a balanced mode when the switch is coupled to the predetermined resistive load and has Doherty mode when the switch is coupled to the predetermined reactive load.

4. The amplifier circuit of claim 1, wherein the reactive load is reconfigurable.

5. The amplifier circuit of claim 1, wherein the first position of the switch is between an isolation port of the output quadrature coupler and the pre-determined resistive load and the second position of the switch is between the isolation port of the output quadrature coupler and the predetermined reactive load.

6. The amplifier circuit of claim 1, wherein the switch comprises single-pole multi-through SPNT circuitry.

7. The amplifier circuit of claim 1, wherein the switch comprises solid state devices.

8. The amplifier circuit of claim 1, further comprising a control circuit connected to the switch for actuating the switch.

9. The amplifier circuit of claim 1, wherein the input quadrature coupler is a 90-degree quadrature hybrid.

10. The amplifier circuit of claim 1, wherein the output quadrature coupler is a 90-degree quadrature hybrid.

11. The amplifier circuit of claim 1, wherein the switch is one of silicon on isolator (SOI), microelectromechanical systems (MEMS), silicon on sapphire (SOS), GaAs pHEMT, and complimentary metal on semiconductor (CMOS).

12. The amplifier circuit of claim 4, wherein reconfigurable reactive load comprising switches or varactors.

13. The amplifier circuit of claim 6, wherein the SPNT circuitry is reconfigurable to realize the reactive load.

14. The amplifier circuit of claim 1, wherein comprises one of lumped elements, coupled-line coupler, branch-line coupler, slow-wave coupler, and transformer-based coupler.

15. The amplifier circuit of claim 1, wherein the adaptive biasing changes the DC quiescent condition of each sub amplifiers.

16. The amplifier circuit of claim 15, wherein, for amplifiers comprising field-effect transistors (FETs), the adaptive biasing is applied to the gate terminals of the FETs.

17. The amplifier circuit of claim 15, wherein, for amplifiers built with bipolar-junction transistors (BJTs), the adaptive biasing is applied to the base terminals of the BJTs.

18. An antenna system comprising:
at least one power amplifier, the power amplifier comprising:
two amplifiers with adaptive biasing coupled in quadrature phase via an input quadrature coupler and an output quadrature coupler; and
a switch connected to the output quadrature coupler, the switch moveable between a predetermined resistive load and a predetermined reactive load; and
a system on chip control circuit,
wherein the power amplifier has a balanced mode when the switch is coupled to the predetermined resistive load and has Doherty mode when the switch is coupled to the predetermined reactive load.

19. A portable communication device comprising the antenna system of claim 18.

* * * * *

UNITED STATES PATENT AND TRADEMARK OFFICE
CERTIFICATE OF CORRECTION

| | | |
|---|---|---|
| PATENT NO. | : 11,362,625 B2 | |
| APPLICATION NO. | : 16/888046 | |
| DATED | : June 14, 2022 | |
| INVENTOR(S) | : Kenle Chen | |

It is certified that error appears in the above-identified patent and that said Letters Patent is hereby corrected as shown below:

On the Title Page

Item (73), the assignee name --University of Central Florida-- should be --University of Central Florida Research Foundation, Inc.--

Signed and Sealed this
Fourth Day of July, 2023

Katherine Kelly Vidal
*Director of the United States Patent and Trademark Office*